United States Patent
Moe et al.

(10) Patent No.: US 12,102,010 B2
(45) Date of Patent: Sep. 24, 2024

(54) METHODS OF FORMING FILMS INCLUDING SCANDIUM AT LOW TEMPERATURES USING CHEMICAL VAPOR DEPOSITION TO PROVIDE PIEZOELECTRIC RESONATOR DEVICES AND/OR HIGH ELECTRON MOBILITY TRANSISTOR DEVICES

(71) Applicant: Akoustis, Inc., Huntersville, NC (US)

(72) Inventors: Craig Moe, Penfield, NY (US); Jeffrey M. Leathersich, Rochester, NY (US)

(73) Assignee: Akoustis, Inc., Huntersville, NC (US)

( * ) Notice: Subject to any disclaimer, the term of this patent is extended or adjusted under 35 U.S.C. 154(b) by 840 days.

(21) Appl. No.: 17/193,623

(22) Filed: Mar. 5, 2021

(65) Prior Publication Data

US 2021/0280634 A1    Sep. 9, 2021

Related U.S. Application Data

(60) Provisional application No. 63/063,196, filed on Aug. 7, 2020, provisional application No. 62/985,572, filed on Mar. 5, 2020.

(51) Int. Cl.
*H03H 3/02* (2006.01)
*H01L 29/20* (2006.01)
(Continued)

(52) U.S. Cl.
CPC ......... *H10N 39/00* (2023.02); *H01L 29/2003* (2013.01); *H01L 29/205* (2013.01);
(Continued)

(58) Field of Classification Search
CPC ...... H10N 39/00; H10N 30/03; H10N 30/076; H10N 30/093; H10N 30/10516;
(Continued)

(56) References Cited

U.S. PATENT DOCUMENTS

| 5,231,327 A | 7/1993 | Ketcham |
| 5,680,008 A | 10/1997 | Brandes et al. |

(Continued)

FOREIGN PATENT DOCUMENTS

| CN | 1662674 A | 8/2005 |
| CN | 1929302 A | 3/2007 |

(Continued)

OTHER PUBLICATIONS

Stefano Leone, Jana Ligi, Christian Manz, Lutz Kirste, et al. "Metal-Organic Chemical Vapor Deposition of Aluminum Scandium Nitride" Physical Wiley Online Library/ Physical Status Solidi vol. 14, Issue 1 pp. 1-6 (Year: 2019).*

(Continued)

*Primary Examiner* — David Vu
*Assistant Examiner* — Brandon C Fox

(57) ABSTRACT

A method of forming a film can include heating a CVD reactor chamber containing a substrate to a temperature range between about 750 degrees Centigrade and about 950 degrees Centigrade, providing a first precursor comprising Al to the CVD reactor chamber in the temperature range, providing a second precursor comprising Sc to the CVD reactor chamber in the temperature range, providing a third precursor comprising nitrogen to the CVD reactor chamber in the temperature range, and forming the film comprising ScAlN on the substrate.

33 Claims, 15 Drawing Sheets

(51) Int. Cl.
| | |
|---|---|
| *H01L 29/205* | (2006.01) |
| *H01L 29/66* | (2006.01) |
| *H01L 29/778* | (2006.01) |
| *H03H 9/02* | (2006.01) |
| *H03H 9/17* | (2006.01) |
| *H10N 30/00* | (2023.01) |
| *H10N 30/03* | (2023.01) |
| *H10N 30/076* | (2023.01) |
| *H10N 30/093* | (2023.01) |
| *H10N 39/00* | (2023.01) |

(52) U.S. Cl.
CPC .... *H01L 29/66462* (2013.01); *H01L 29/7786* (2013.01); *H03H 3/02* (2013.01); *H03H 9/02031* (2013.01); *H03H 9/173* (2013.01); *H03H 9/176* (2013.01); *H10N 30/03* (2023.02); *H10N 30/076* (2023.02); *H10N 30/093* (2023.02); *H10N 30/708* (2024.05); *H03H 2003/021* (2013.01)

(58) Field of Classification Search
CPC ............... H01L 29/2003; H01L 29/205; H01L 29/66462; H01L 29/7786; H03H 3/02; H03H 9/02031; H03H 9/173; H03H 9/176; H03H 2003/021
See application file for complete search history.

(56) References Cited

U.S. PATENT DOCUMENTS

| | | | |
|---|---|---|---|
| 5,849,076 A | 12/1998 | Gaylord et al. | |
| 5,894,647 A | 4/1999 | Lakin | |
| 6,051,907 A | 4/2000 | Ylilammi | |
| 6,114,635 A | 9/2000 | Lakin et al. | |
| 6,262,637 B1 | 7/2001 | Bradley et al. | |
| 6,377,137 B1 | 4/2002 | Ruby | |
| 6,384,697 B1 | 5/2002 | Ruby | |
| 6,472,954 B1 | 10/2002 | Ruby et al. | |
| 6,572,706 B1 | 6/2003 | Nguyen | |
| 6,583,690 B2 | 6/2003 | Lee et al. | |
| 6,617,060 B2 | 9/2003 | Weeks, Jr. et al. | |
| 6,812,619 B1 | 11/2004 | Kaitila et al. | |
| 6,841,922 B2 | 1/2005 | Aigner et al. | |
| 6,864,619 B2 | 3/2005 | Aigner et al. | |
| 6,879,224 B2 | 4/2005 | Frank | |
| 6,902,620 B1 | 6/2005 | Omstead et al. | |
| 6,909,340 B2 | 6/2005 | Aigner et al. | |
| 6,933,807 B2 | 8/2005 | Marksteiner et al. | |
| 7,112,860 B2 | 9/2006 | Saxler | |
| 7,250,360 B2 | 7/2007 | Shealy et al. | |
| 7,268,436 B2 | 9/2007 | Aigner et al. | |
| 7,365,619 B2 | 4/2008 | Aigner et al. | |
| 7,514,759 B1 | 4/2009 | Mehta et al. | |
| 7,777,777 B2 | 8/2010 | Bowman et al. | |
| 7,875,910 B2 | 1/2011 | Sheppard et al. | |
| 7,982,363 B2 | 7/2011 | Chitnis | |
| 8,304,271 B2 | 11/2012 | Huang et al. | |
| 8,440,259 B2 | 5/2013 | Chiang et al. | |
| 8,772,758 B2 | 7/2014 | Hardy et al. | |
| 9,136,819 B2 | 9/2015 | Grannen et al. | |
| 9,309,473 B2 | 4/2016 | McAlister | |
| 10,110,190 B2 | 10/2018 | Vetury et al. | |
| 10,187,036 B2 | 1/2019 | Yokoyama et al. | |
| 10,230,350 B2 | 3/2019 | Hey-Shipton | |
| 10,389,331 B2 * | 8/2019 | Hurwitz | H03H 9/0523 |
| 10,797,681 B1 | 10/2020 | Hurwitz et al. | |
| 10,873,317 B2 | 12/2020 | Shen et al. | |
| 2003/0003866 A1 | 1/2003 | Overy et al. | |
| 2003/0039866 A1 | 2/2003 | Mitamura | |
| 2004/0025787 A1 | 2/2004 | Selbrede et al. | |
| 2004/0130411 A1 | 7/2004 | Beaudin et al. | |
| 2004/0200412 A1 | 10/2004 | Frijlink | |
| 2005/0011459 A1 | 1/2005 | Liu | |
| 2005/0093397 A1 | 5/2005 | Yamada et al. | |
| 2005/0140246 A1 | 6/2005 | Wang et al. | |
| 2005/0219012 A1 | 10/2005 | Milsom et al. | |
| 2005/0255234 A1 | 11/2005 | Kanda et al. | |
| 2006/0028298 A1 | 2/2006 | Nakamura et al. | |
| 2006/0144338 A1 | 7/2006 | Liu et al. | |
| 2006/0214539 A1 | 9/2006 | Sato | |
| 2006/0249081 A1 | 11/2006 | Schumacher et al. | |
| 2006/0283255 A1 | 12/2006 | Tilak et al. | |
| 2007/0057599 A1 | 3/2007 | Motai et al. | |
| 2007/0080611 A1 | 4/2007 | Yamada et al. | |
| 2007/0117363 A1 | 5/2007 | Sakamoto et al. | |
| 2007/0234692 A1 | 10/2007 | Midorikawa et al. | |
| 2007/0234962 A1 | 10/2007 | Suzuki et al. | |
| 2007/0279152 A1 | 12/2007 | Kawamura | |
| 2008/0024042 A1 | 1/2008 | Isobe et al. | |
| 2008/0182358 A1 | 7/2008 | Cowdery-Corvan et al. | |
| 2008/0258731 A1 | 10/2008 | Smith et al. | |
| 2008/0284541 A1 | 11/2008 | Chitnis | |
| 2009/0033177 A1 | 2/2009 | Itaya et al. | |
| 2009/0102319 A1 | 4/2009 | Nakatsuka et al. | |
| 2010/0148637 A1 | 6/2010 | Satou | |
| 2010/0192854 A1 | 8/2010 | Nishino et al. | |
| 2010/0301371 A1 | 12/2010 | Roth et al. | |
| 2010/0301379 A1 | 12/2010 | Yokoyama et al. | |
| 2011/0114968 A1 | 5/2011 | Sheppard et al. | |
| 2011/0137184 A1 | 6/2011 | Ren et al. | |
| 2011/0298564 A1 | 12/2011 | Iwashita et al. | |
| 2012/0049976 A1 | 3/2012 | Son et al. | |
| 2012/0068191 A1 | 3/2012 | Marchand et al. | |
| 2012/0107557 A1 | 5/2012 | Akiyama et al. | |
| 2012/0194297 A1 | 8/2012 | Choy et al. | |
| 2012/0287575 A1 | 11/2012 | Nelson | |
| 2012/0298207 A1 | 11/2012 | Woelk et al. | |
| 2013/0111719 A1 | 5/2013 | Deguet et al. | |
| 2013/0140525 A1 | 6/2013 | Chen et al. | |
| 2013/0176086 A1 | 7/2013 | Bradley et al. | |
| 2013/0183444 A1 | 7/2013 | Soininen et al. | |
| 2013/0209685 A1 | 8/2013 | Ku et al. | |
| 2013/0236634 A1 | 9/2013 | Choi et al. | |
| 2013/0327266 A1 | 12/2013 | Arena et al. | |
| 2014/0030444 A1 | 1/2014 | Swaminathan et al. | |
| 2014/0132117 A1 | 5/2014 | Larson, III | |
| 2014/0246305 A1 | 9/2014 | Larson, III | |
| 2014/0318443 A1 | 10/2014 | Fenwick et al. | |
| 2014/0327013 A1 | 11/2014 | Schenk et al. | |
| 2014/0342512 A1 | 11/2014 | Mishra et al. | |
| 2015/0028346 A1 | 1/2015 | Palacios et al. | |
| 2015/0097638 A1 | 4/2015 | Yu et al. | |
| 2015/0318837 A1 | 11/2015 | Zou et al. | |
| 2015/0357993 A1 | 12/2015 | Shealy | |
| 2015/0381144 A1 | 12/2015 | Bradley et al. | |
| 2016/0028367 A1 | 1/2016 | Shealy | |
| 2016/0036580 A1 | 2/2016 | Shealy | |
| 2016/0064645 A1 | 3/2016 | Teshigahara et al. | |
| 2016/0163827 A1 | 6/2016 | Cheng et al. | |
| 2016/0203972 A1 | 7/2016 | Sundaram et al. | |
| 2016/0208414 A1 | 7/2016 | Odawara et al. | |
| 2016/0218271 A1 | 7/2016 | Sakuma et al. | |
| 2016/0339702 A1 | 11/2016 | Kobayashi et al. | |
| 2017/0149405 A1 | 5/2017 | Kishimoto | |
| 2017/0214385 A1 | 7/2017 | Bhattacharjee | |
| 2017/0264256 A1 | 9/2017 | Gibb et al. | |
| 2017/0288628 A1 | 10/2017 | Grannen et al. | |
| 2017/0294529 A1 | 10/2017 | Beam, III et al. | |
| 2017/0310299 A1 | 10/2017 | Bower et al. | |
| 2018/0013405 A1 | 1/2018 | Takata | |
| 2018/0026604 A1 | 1/2018 | Yokoyama et al. | |
| 2018/0054176 A1 | 2/2018 | Kim et al. | |
| 2018/0069168 A1 | 3/2018 | Ikeuchi et al. | |
| 2018/0138885 A1 | 5/2018 | Stokes et al. | |
| 2018/0152168 A1 | 5/2018 | Han et al. | |
| 2018/0174826 A1 | 6/2018 | Raaijmakers et al. | |
| 2018/0278236 A1 | 9/2018 | Hurwitz | |
| 2018/0323767 A1 | 11/2018 | Then et al. | |
| 2018/0342999 A1 * | 11/2018 | Gibb | H03H 9/0523 |
| 2019/0036511 A1 | 1/2019 | Choy et al. | |
| 2019/0036592 A1 | 1/2019 | Shealy et al. | |
| 2019/0081611 A1 | 3/2019 | Vetury et al. | |

(56) References Cited

U.S. PATENT DOCUMENTS

| | | | |
|---|---|---|---|
| 2019/0149127 | A1 | 5/2019 | Lee et al. |
| 2019/0199316 | A1 | 6/2019 | Houlden et al. |
| 2019/0259934 | A1 | 8/2019 | Gibb et al. |
| 2019/0305039 | A1 | 10/2019 | Wang et al. |
| 2019/0305753 | A1 | 10/2019 | Shealy |
| 2019/0346705 | A1* | 11/2019 | Soltani .............. H01L 21/02505 |
| 2020/0111949 | A1 | 4/2020 | Moe et al. |
| 2020/0152858 | A1 | 5/2020 | Moe et al. |
| 2020/0220514 | A1 | 7/2020 | Kim et al. |
| 2021/0066070 | A1 | 3/2021 | Leone et al. |
| 2021/0104993 | A1 | 4/2021 | Vetury et al. |
| 2021/0280634 | A1 | 9/2021 | Moe et al. |
| 2022/0014175 | A1 | 1/2022 | Nagatomo et al. |

FOREIGN PATENT DOCUMENTS

| | | | |
|---|---|---|---|
| JP | H09321361 | A | 12/1997 |
| JP | 2009100197 | A | 5/2009 |
| JP | 2010068109 | A | 3/2010 |
| JP | 4895520 | B2 | 3/2012 |
| KR | 20120023285 | A | 3/2012 |
| WO | WO 2005034349 | A1 | 4/2005 |
| WO | WO 2016122877 | | 8/2016 |
| WO | 2017095437 | A1 | 6/2017 |
| WO | 2017096437 | A1 | 6/2017 |
| WO | 2017171856 | A1 | 10/2017 |
| WO | 2017222990 | A1 | 12/2017 |
| WO | 2021178854 | A1 | 9/2021 |

OTHER PUBLICATIONS

Hao et al., "Single Crystalline ScAlN Acoustic Wave Resonators with Large Figure of Merit (Q?kts)", (2019) International Microwave Symposium.

Leone et al., "Metal-Organic Chemical Vapor Deposition of Aluminum Scandium Nitride", Physica Status Solidi, Nov. 7, 2019.

Notification of The International Search Report and The Written Opinion of the International Searching Authority for PCT/US/2021/21160; mailing date Jul. 21, 2021; 15 pages.

Wikipedia "Field-effect transistor" Dec. 24, 2019, https://en.wikipedia.org/w/index.php?title=Field-effect_transistor&oldid=932242122.

Wikipedia "High-electron mobility transistor" Jan. 2, 2019; https://en.wikipedia.org/w/index.php?title=High-electron-mobility_transistor&oldid=876524143.

International Search Report and Written Opinion, PCT/US2018/050521, Jan. 28, 2019.

International Search Report and Written Opinion, PCT/US2015/034560, Sep. 18, 2015.

International Search Report and Written Opinion, PCT/US2021/016527, Oct. 26, 2021.

International Search Report and Written Opinion for PCT/US2020/45658, mailed Nov. 6, 2020, 14 pages.

International Search Report and Written Opinion for PCT/US2021/27678, mailed Jul. 21, 2021, 11 pages.

Yokoyama et al; "Effect of Mg and Zr Co-Doping on Piezoelectric AlN Thin Films for bulk Acoustic Wave Resonaters"; IEEE Transactions on Ultrasonics, Ferroelectrics, and Frequency Control, vol. 61, No. 8; Aug. 2014; pp. 1322-1328.

Yokoyama et al; "Dopant Concentration Dependence of Electromechanical Coupling Coefficients of Co-doped AlN Thin Films for BAW Devices;" IEEE International Ultrasonics Symposium Proceedings; (2016); 4 pages.

Hardy et al., Epitaxial ScAlN Grown by Molecular Beam Epitaxy on GaN and SiC Substrates; Appl. Phys. Lett. 110, 2017; 6 pages.

Hardy et al., Epitaxial ScAlN Etch-Stop Layers Grown by Molecular Beam Epitaxy for Selective Etching of AlN and GaN; IEEE Transactions on Semiconductor Manufacturing, vol. 30, No. 4, Nov. 2017; pp. 475-479.

Ligl et al., Metalorganic Chemical Vapor Phase deposition of AlScN/GaN Heterostructures; J. Appl. Phys. 127, 195704 (2020); https://doi.org/10.1063/5.0003095; 9 pages.

International Search Report and Written Opinion for PCT/US2021/013923; Apr. 1, 2021, 24 pages.

International Preliminary Report on Patentability and Written Opinion, PCT/US2020/040985, Nov. 2, 2021.

Notification of Transmittal of the International Search Report and the Written Opinion of the International Searching Authority, or the Declaration, PCT/US2021/061557, Feb. 18, 2022.

International Search Report And Written Opinion, International Application No. PCT/US2023/061081, mailed Jun. 21, 2023, 8 pages.

Hickman et al., High Breakdown Voltage in Strained AlN/GaN/AlN Quantum Well HEMTs, IEEE Electron Device Letters, vol. X, No. Y, Jan. 2018, pp. 7-10.

International Search Report and Written Opinion, PCT/US2020/040985, Sep. 30, 2020; 13 pages.

Notification Concerning Transmittal of International Preliminary Report on Patentability for PCT/US2020/040648, dated Nov. 25, 2021, 12 pages.

Chinese Office Action, CN202180007823.5, Feb. 1, 2024, 12 pages.
Office Action, U.S. Appl. No. 17/582,613, Dec. 15, 2023, 43 pages.
Office Action, U.S. Appl. No. 17/193,623, Feb. 1, 2024, 33 pages.
Notification Concerning Transmittal of IPRP, PCT/US2020/045658, Feb. 24, 2022, 13 pgs.

International Search Report and Written Opinion; PCT/US2023/064639; mailed Oct. 3, 2023; 8 pages.

Aluminum Nitride; ChemBK; Article; https//www.chembk.com/en/chem/Aluminum%20nitride; Jan. 2022; 7 pages.

Tungsten; National Library of Medicine; Article; https//pubchem.ncbi.nlm.nih.gov/compound/Tungsten; Sep. 2004; 3 pages.

International Search Report and Written Opinion, PCT/US2020/040648, Jully 2, 2020; 13 pages.

* cited by examiner

METHODS OF FORMING FILMS INCLUDING SCANDIUM AT LOW TEMPERATURES USING CHEMICAL VAPOR DEPOSITION TO PROVIDE PIEZOELECTRIC RESONATOR DEVICES AND/OR HIGH ELECTRON MOBILITY TRANSISTOR DEVICES

The present application claims the priority of U.S. Provisional Application No. 62/985,572, titled Methods of Forming Crystal Piezoelectric Layers Including Low Carbon and/or Oxygen Concentrations Using Metalorganic Precursors in CVD Systems and Related Crystal Piezoelectric Layers, filed in the U.S.P.T.O. on Mar. 5, 2020, the entire disclosure of which is incorporated herein by reference.

BACKGROUND

The present invention relates generally to electronic devices. More particularly, the present invention provides methods of forming $Sc_xAl_{1-x}N$ films for use as, for example, piezoelectric layers in bulk acoustic wave resonator devices and RF devices (such as HEMTs) etc.

SUMMARY

Figure 1:
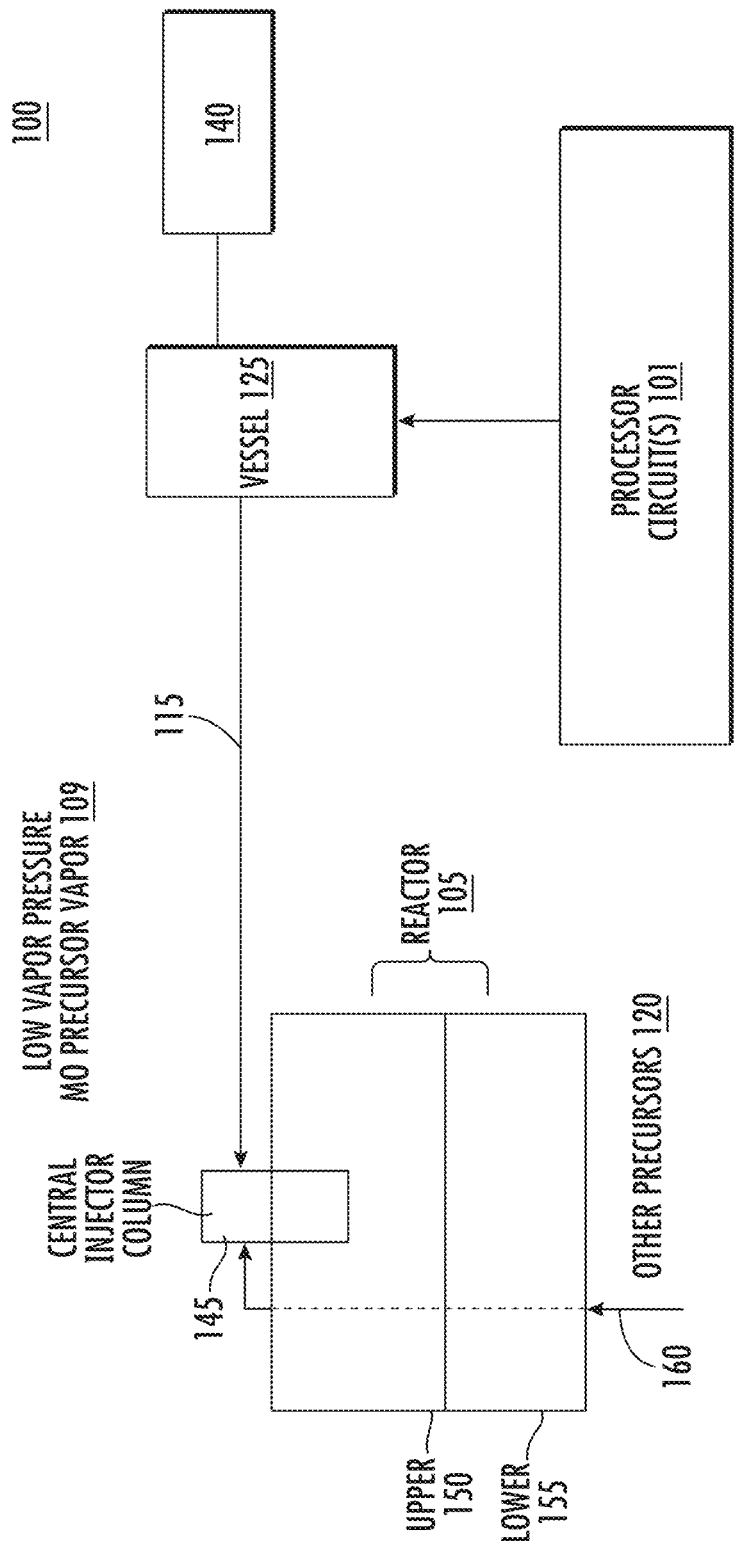
FIG. 1 is a schematic diagram of a Metal Organic Chemical Vapor Deposition (MOCVD) system that can be used to form $Sc_xAl_{1-x}N$ films in some embodiments according to the invention.

Embodiments according to the invention can provide methods of forming films including scandium at low temperatures using chemical vapor deposition to provide piezoelectric resonator devices and/or high electron mobility transistor devices. Pursuant to these embodiments a method of forming a film can include heating a CVD reactor chamber containing a substrate to a temperature range between about 750 degrees Centigrade and about 950 degrees Centigrade, providing a first precursor comprising Al to the CVD reactor chamber in the temperature range, providing a second precursor comprising Sc to the CVD reactor chamber in the temperature range, providing a third precursor comprising nitrogen to the CVD reactor chamber in the temperature range, and forming the film comprising ScxAl1-xN on the substrate.

DETAILED DESCRIPTION OF EMBODIMENTS ACCORDING TO THE INVENTION

As appreciated by the present inventors, $Sc_xAl_{1-x}N$ films can be formed using Chemical Vapor Deposition (CVD) at relatively low temperature so that the resulting films can be substantially free of segregation so that, for example, the $Sc_xAl_{1-x}N$ films can have a uniform wurtzite crystal structure. In such films according to embodiments of the invention, the CVD process can be performed at relatively low temperature, which can improve the surface morphology of the $Sc_xAl_{1-x}N$ film. For example, in some embodiments the CVD growth process to form the $Sc_xAl_{1-x}N$ can be performed in a temperature range between about 750 degrees Centigrade and about 950 degrees Centigrade. As further appreciated by the present inventors, a $Sc_xAl_{1-x}N$ film formed at higher temperatures can exhibit segregation where the composition of the film can vary such that some portions can be rich in Sc and other portions can be rich in Al. In contrast, when the CVD growth process is performed at too low a temperature, the wurtzite crystal structure may be difficult to maintain, resulting in an amorphous $Sc_xAl_{1-x}N$ film with Al and Sc evenly distributed throughout.

In further embodiments according to the invention, the morphology of the $Sc_xAl_{1-x}N$ film can be improved by the use of a Sc precursor that can be characterized as containing both cyclopentadienyl ligands and amidinate ligands. As further appreciated by the present inventors, the presence of amidinate ligands can allow for greater adatom mobility of a growth surface and more complete disassociation of the molecule, which can produce films with smoother surfaces at lower growth temperature than other precursors. In some embodiments according to the invention, the Sc precursor can be characterized as containing amidinate ligands where there is one N atom for each outer shell electron of the Sc. In some embodiments according to the invention, the Al precursor can be a metalorganic containing Al as a component, such as trimethylaluminum or triethylaluminum. Other metalorganic precursors containing Al can also be used in some embodiments according to the invention.

As further appreciated by the present invention, the film morphology can also be improved by controlling the ratio of the Group V (e.g., a precursor comprising nitrogen, such as $NH_3$) precursor to the Group III precursors (e.g., Sc and Al precursors) used during the CVD growth process. The ratio can affect the adatom mobility of the Group-III species on the growth surface. In particular, if the ratio is too high the film may roughen, whereas if the ratio is too low, the Sc adatoms may accumulate and cause Sc/Al segregation in the film. In some embodiments, an underlying nucleation layer can also help improve the morphology of the $Sc_xAl_{1-x}N$ film.

As further appreciated by the present inventors, as described herein the $Sc_xAl_{1-x}N$ film can also be formed to have a low-carbon content. For example, in some embodiments the CVD process can be used to form $Sc_xAl_{1-x}N$ films having an impurity incorporation that is less than about $10^{19}/cm^3$ or less than about 0.001% of the material. In still other embodiments according to the invention, the $Sc_xAl_{1-x}N$ film can also have low concentrations of Oxygen and/or Silicon.

In some embodiments according to the present invention, the CVD grown $Sc_xAl_{1-x}N$ films described herein can be used as used as piezoelectric resonator layers in, for example, Bulk Acoustic Wave (BAW) based resonators or filter circuits. In some embodiments according to the present invention, the CVD grown $Sc_xAl_{1-x}N$ films described herein can be used as the barrier layer in a High Electron Mobility Transistor (HEMT) device operating at, for example at RF frequencies. In some embodiments according to the present invention, the CVD grown $Sc_xAl_{1-x}N$ films described herein can be a shared layer that provides both a piezoelectric resonator layer and a buffer layer of the HEMT device.

FIG. 1 is a schematic diagram of a Metal Organic Chemical Vapor Deposition (MOCVD) system 100 that can be used to form $Sc_xAl_{1-x}N$ films in some embodiments according to the invention. According to FIG. 1, the MOCVD system 100 can include a horizontal flow CVD reactor 105 supplied with a low vapor pressure MO precursor vapor 109 routed to the CVD reactor 105 from a vessel 125 in some embodiments according to the invention. The CVD reactor 105 can include an upper portion 150 and a lower portion 155 that are moveably coupled together. In operation, the upper portion 150 can separate from the lower portion 155 to expose a planetary wafer transport system so that wafers may be loaded into a plurality of wafer stations. The vessel 125 contains the Sc precursor material used to generate the low vapor pressure MO precursor vapor 109 for formation of the $Sc_xAl_{1-x}N$ film. It will be understood that other types of CVD reactors can be used in place of the horizontal flow CVD reactor 105.

A central injector column 145 penetrates the upper portion 150 of the reactor 105 and is coupled to separate lines configured to carry different precursors into the CVD reactor 105. In particular, the central injector column 145 is coupled to a low vapor pressure MO precursor line 115 that carries the low vapor pressure MO precursor vapor 109. In some embodiments according to the invention, the low vapor pressure MO precursor vapor 109 can be provided to the reactor 105 under control of a processor circuit 101. For example, in some embodiments according to the invention, the MOCVD system 100 operates under the control of the processor circuit 101 to maintain the temperature of the interior of the reactor 105 at a temperature at which the $Sc_xAl_{1-x}N$ film is formed on the substrate. In some embodiments according to the invention, the interior of the reactor 105 can be maintained at a temperature in a range, for example, between about 750 degrees Centigrade and about 950 degrees Centigrade during formation of the $Sc_xAl_{1-x}N$ film. In still further embodiments, the processor circuit 101 may also heat the line 115 so that the precursor vapor 109 can be provided to the reactor 105 at a temperature in a range, for example, between more than 70 degrees Centigrade to about 200 degrees Centigrade.

As further shown in FIG. 1, other precursors 120, such as the precursors of Al and N, can also be provided to the central injector column 145 via a path 160 that can be separated from the line 115. In some embodiments, the other precursors can include other metal organic precursors as wells as hydrides. It will be understood that the path 160 and the line 115 may be located to be thermally isolated from one another so that the Sc precursor vapor 109 can be delivered to the central injector column 145 without substantially affecting the temperature of the other precursors 120. In other words, in some embodiments according to the invention, the line 115 can be located so that the vapor 109 can be heated without substantially heating the other precursors 120. It will be understood that the ScAlN films described herein can be formed using an MOCVD system where the $Sc_xAl_{1-x}N$, as described in, U.S. patent application Ser. No. 16/784,843, entitled Apparatus For Forming Single Crystal Piezoelectric Layers Using Low-Vapor Pressure Metalorganic Precursors in CVD Systems And Methods of Forming Single Crystal Piezoelectric Layers Using The Same, filed in the USPTO on Feb. 7, 2020 which is commonly assigned to the present assignee, the entirety of which is hereby incorporated herein by reference.

In operation, the MOCVD system 100 can be used to form $Sc_xAl_{1-x}N$ films at relatively low temperature on a substrate. In some embodiments according to the invention, the interior of the CVD reactor 105 can be maintained at a temperature in a range between about 750 degrees Centigrade to about 950 degrees Centigrade. In contrast, as appreciated by the present inventors, a $Sc_xAl_{1-x}N$ film that is formed at higher temperatures may exhibit segregation where the composition of the film varies in that that some portions can be rich in Sc and other portions are rich in Al.

Figure 2A:
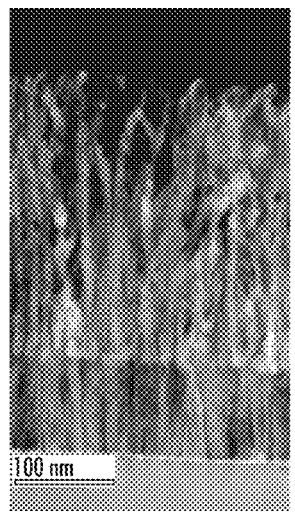
FIGS. 2A-2D are EELS images of a $Sc_xAl_{1-x}N$ film including a composite EELS image, a Sc EELS image, a N EELS image, and an Al EELS image, respectively, formed using CVD at a relatively high temperature of about 1150 degrees Centigrade.
Figure 2B:
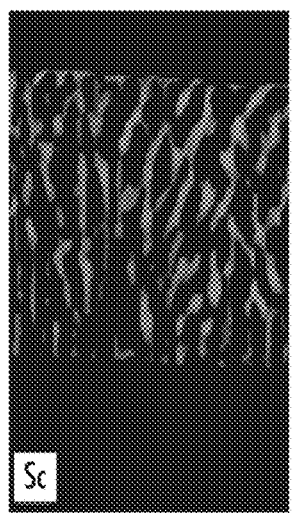
Figure 2C:
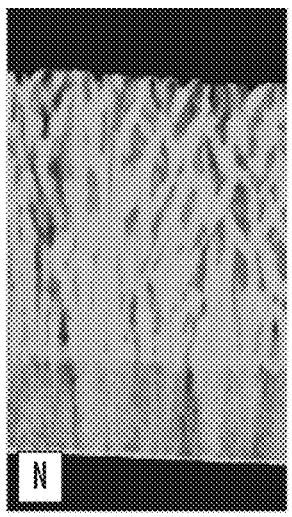
Figure 2D:
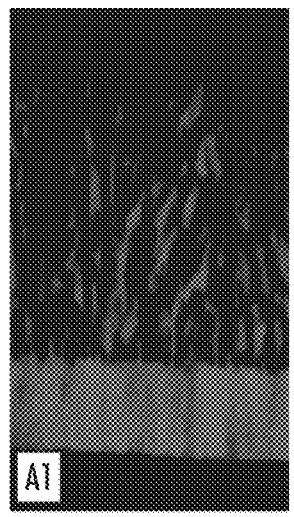

For example, FIGS. 2A-2D are EELS images of a $Sc_xAl_{1-x}N$ film formed using CVD at a temperature of about 1150 degrees Centigrade. As shown in FIGS. 2B and 2D, $Sc_xAl_{1-x}N$ films grown using CVD at temperature greater than 950 degrees Centigrade begin to exhibit Si-rich composition and Al-rich composition, respectively. Furthermore, as appreciated by the present inventors, the desired wurtzite crystal structure of $Sc_xAl_{1-x}N$ proves difficult to maintain in films grown using CVD at temperatures less than about 750 degrees Centigrade, as shown in FIG. 2E.

Figure 2E:
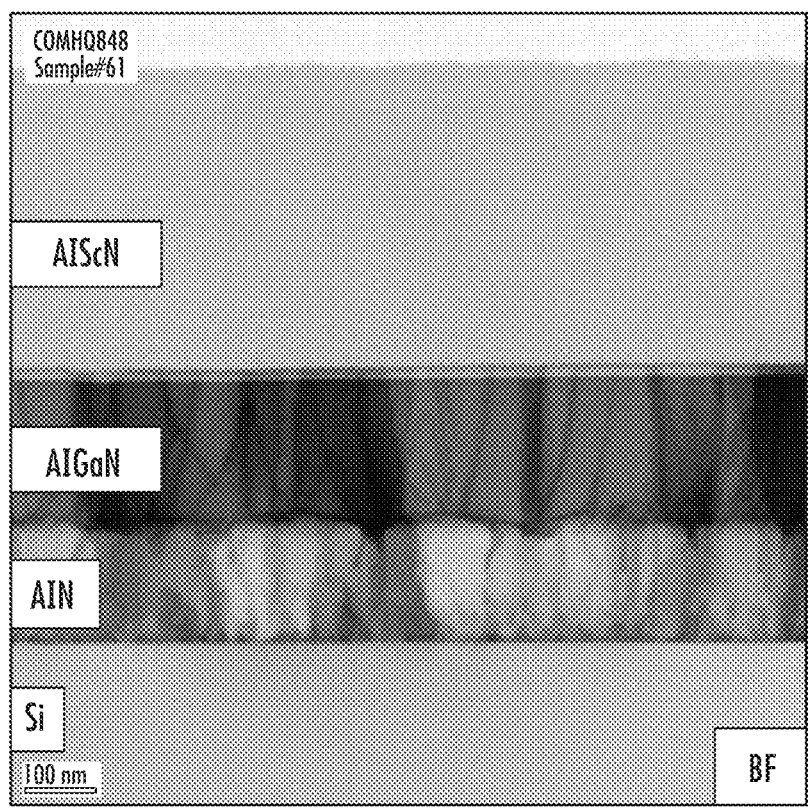
FIG. 2E is a TEM image of a $Sc_xAl_{1-x}N$ film formed at a temperature less than about 750 degrees Centigrade.

FIG. 2E is a TEM image of a $Sc_xAl_{1-x}N$ (or $Al_{1-x}Sc_xN$) film formed at a temperature less than about 750 degrees Centigrade. As shown in FIG. 2E, the ScAlN film on the AlGaN layer is amorphous, which demonstrates the difficulty in providing a wurtzite crystal structure for the $Sc_xAl_{1-x}N$ (or $Al_{1-x}Sc_xN$) film formed via MOCVD at temperatures less than about 750, as appreciated by the present inventors.

Figure 3A:
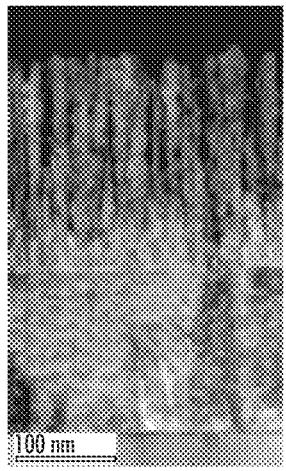
FIGS. 3A-3D are EELS images of a $Sc_xAl_{1-x}N$ film including a composite EELS image, a Sc EELS image, a N EELS image, and an Al EELS image, respectively, formed using CVD at a temperature about 850 of degrees Centigrade in some embodiments according to the invention.
Figure 3B:
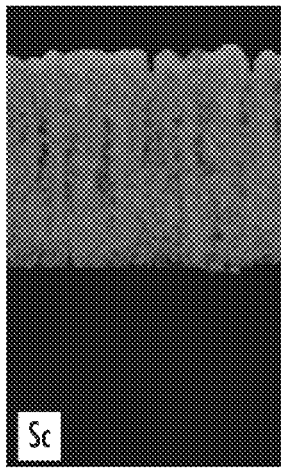
Figure 3C:
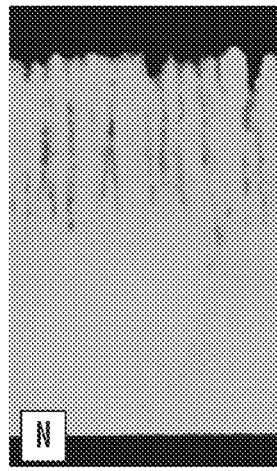
Figure 3D:
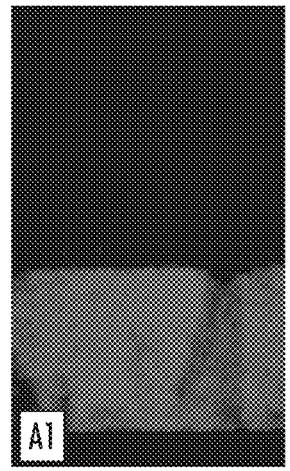

In contrast, FIGS. 3A-3D are EELS images of a $Sc_xAl_{1-x}N$ film including a composite EELS image, a Sc EELS image, a N EELS image, and an Al EELS image, respectively, formed using CVD at a temperature of about 850 degrees Centigrade in some embodiments according to the invention. As shown in FIGS. 3B and 3D, the $Sc_xAl_{1-x}N$ film grown using CVD at a temperature of about 850 degrees Centigrade does not exhibit Si-rich or Al-rich composition. Instead, the $Sc_xAl_{1-x}N$ film exhibits a substantially uniform composition such that the Sc-rich and Al-rich portions shown in FIGS. 2A-2D are substantially eliminated.

Figure 4A:
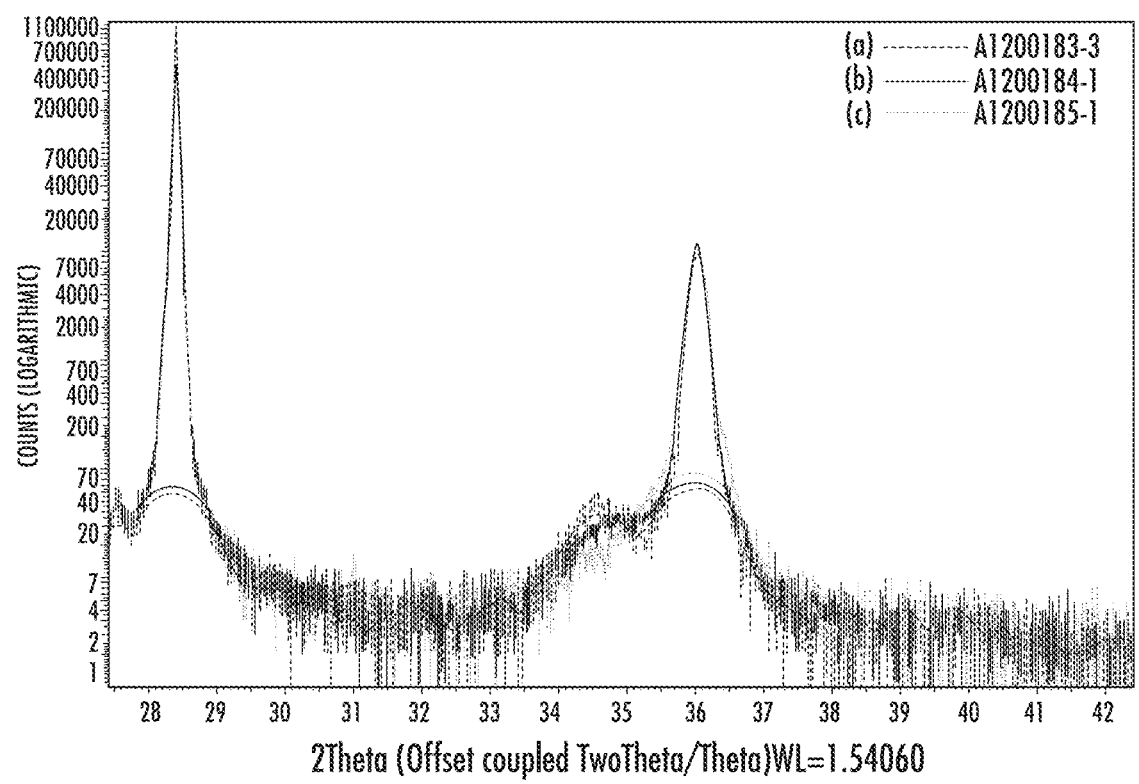
FIG. 4A shows XRD scans of $Sc_xAl_{1-x}N$ films formed using CVD at temperatures of about (a) 1030 degrees Centigrade, (b) 940 degrees Centigrade, and (c) 850 degrees Centigrade in some embodiments according to the invention.

As further appreciated by the present inventors, an XRD scan of a sample a $Sc_xAl_{1-x}N$ film formed as described herein in some embodiments according to the invention demonstrates the substantially uniform composition of the wurtzite crystalline structures in the $Sc_xAl_{1-x}N$ film shown in FIGS. 3A-3D. FIG. 4A shows 2theta-omega scans in an X-Ray diffractometer (XRD) of $Sc_xAl_{1-x}N$ films formed using CVD at temperatures of about (a) 1030 degrees Centigrade, (b) 940 degrees Centigrade, and (c) 850 degrees Centigrade in some embodiments according to the invention. As appreciated by the present inventors, the peak at about 34.5 in film formed at about 1030 degrees Centigrade shown in scan (a) represents segregated Sc, whereas the $Sc_xAl_{1-x}N$ films formed at about 940 degrees Centigrade and about 850 degrees Centigrade shown in scans (b) and (c), respectively have lesser peaks that illustrate substantially uniform composition of the corresponding $Sc_xAl_{1-x}N$ film (relative to scan (a)) such that the films (b) and (c) are substantially free of segregated ScN crystal structures (e.g., rock salt crystalline structures) as indicated by a Sc peak count at about 34.5 degrees in an XRD 2Theta scan that is less than 5% of the Sc peak count at about 36 degrees taken relative to the 110 crystal plane.

Figure 4B:
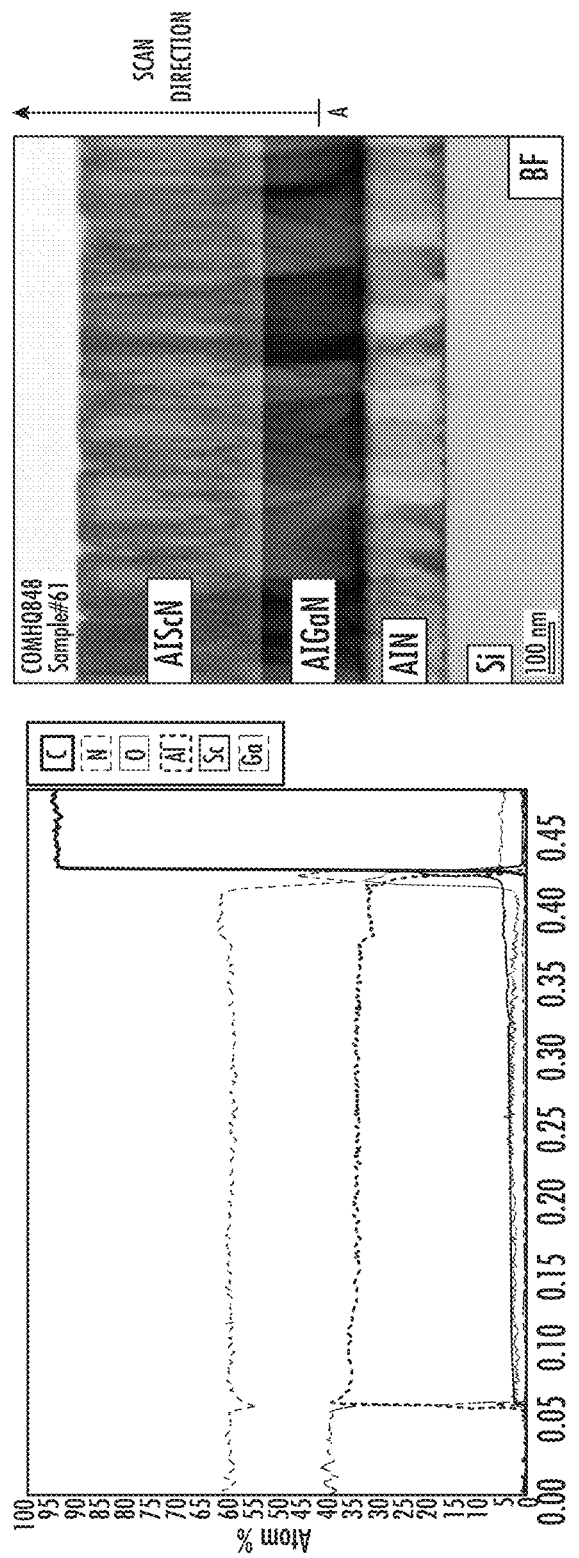
FIG. 4B is an EELS image of a $Sc_xAl_{1-x}N$ film grown on an AlGaN/AlN sequence of layers using a MOCVD process according to embodiments of the present invention.

FIG. 4B is an EELS image of a ScAlN (or AlScN) layer grown on an AlGaN/AlN sequence of layers using the MOCVD process according to embodiments of the present invention. According to FIG. 4B, the ScAlN layer was grown using the MOCVD process at a temperature of about 800 degrees Centigrade. The scan (taken in the direction A) shows that the corresponding portions of the ScAlN layer and the AlGaN layer have substantially uniform composition of wurtzite crystalline structures.

As further appreciated by the present inventors, in further embodiments according to the invention, the morphology of the $Sc_xAl_{1-x}N$ film can be improved by the use of a Sc precursor that can be characterized as containing both cyclopentadienyl ligands and amidinate ligands. As further appreciated by the present inventors, the presence of amidinate ligands can allow for greater adatom mobility of the growth surface and more complete disassociation of the molecule, which can produce smoother films at lower growth temperature than other precursors. In some embodiments according to the invention, the Sc precursor can be characterized as containing amidinate ligands where there is one N atom for each outer shell electron of the Sc.

Figure 5:
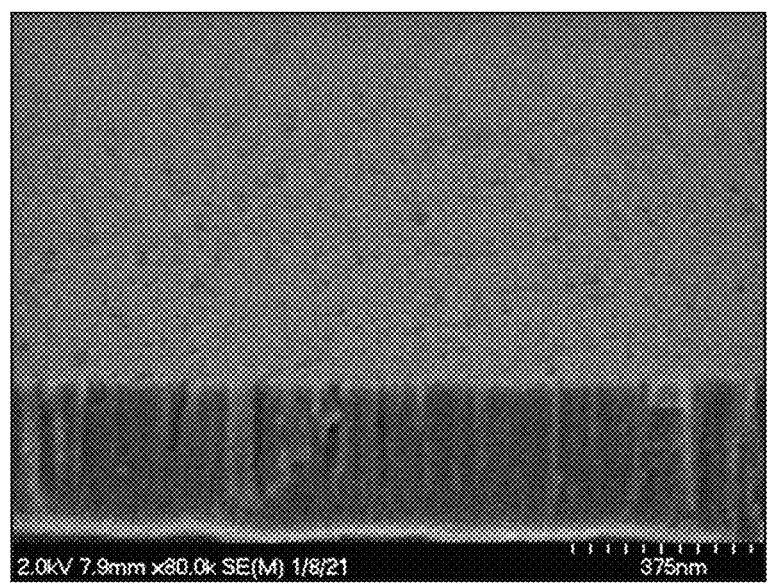
FIG. 5 is an SEM image of 20% $Sc_xAl_{1-x}N$ formed using Scarlet™ as a precursor.

For example, in some embodiments according to the present invention, the precursor provided by the vessel 125 in FIG. 1 can be provided by a precursor characterized by the general formula (1):

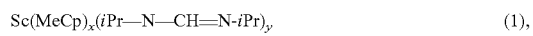 (1), wherein x is 0, 1, or 2, y is 1, 2, or 3, with the proviso that x+y=3, and wherein there is one N atom for each outer shell electron of the Sc when x=0. Accordingly, in some embodiments according to the present invention, the precursor can be a Scandium-containing precursor with diisopropylformamidinate ligands, without methyl cyclopentadienyl ligands. Alternatively, in some embodiments according to the invention, the precursor can be a Scandium-containing precursor with diisopropylforamidinate ligands and with methyl cyclopentadienyl ligands. Lanthanide-containing precursors, for example, with diisopropylforamidinate ligands and with methyl cyclopentadienyl ligands, are described in U.S. Pat. No. 8,283,201, the entirety of which is hereby incorporated herein by reference. Another example, of a Scandium-containing precursor with diisopropylforamidinate ligands and with methyl cyclopentadienyl ligands is marketed by Air Liquide S.A. headquartered in Paris France under the tradename Scarlet™. For example, FIG. 5 is an SEM image of 20% ScAlN film formed using Scarlet™ as a precursor.r In further embodiments according to the present invention, the precursor provided by the vessel 125 in FIG. 1 can be provided by a precursor characterized by the general formula (2):

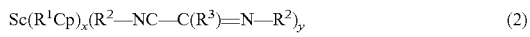 (2)

wherein $R^1$ is H or a $C_1$-$C_5$ alkyl chain, $R^2$ is H or a $C_1$-$C_5$ alkyl chain, $R^3$ is H or Me, x is 0, 1, or 2, y is 1, 2, or 3, with the proviso that x+y=3, and wherein there is one N atom for each outer shell electron of the Sc when x=0. In some embodiments, $R^1$ of the precursor is Me, Et, or iPr. In some embodiments, $R^2$ of the precursor is iPr or tBu. Accordingly, in some embodiments according to the present invention, the precursor can be a Scandium-containing precursor with dialkylformamidinate ligands or dialkylacetamidinate ligands, and alkyl cyclopentadienyl ligands, and/or a Scandium-containing precursor with dialkylformamidinate ligands or acetamidinate ligands, without alkyl cyclopentadienyl ligands. Lanthanide-containing precursors, for example, with dialkylformamidinate ligands and with alkyl cyclopentadienyl ligands, are described in U.S. Pat. No. 8,283,201, the entirety of which is hereby incorporated herein by reference.

As further appreciated by the present inventors, ScAlN films according to the present invention can be formed using MOCVD with a Sc precursor characterizes by general formula (1) at a CVD reactor temperature between about 750 degrees Centigrade to about 950 degrees Centigrade. Alternatively, ScAlN films according to the present invention can be formed using MOCVD with a Sc precursor characterized by general formulae (1) at a CVD reactor temperature outside the temperature range of about 750 degrees Centigrade to about 950 degrees Centigrade.

As further appreciated by the present inventors, $Sc_xAl_{1-x}N$ film formed using MOCVD at relatively low temperatures can also exhibit low-carbon content. For example, in some embodiments, the $Sc_xAl_{1-x}N$ film can be formed on the substrate via the MOCVD process while the reactor is maintained at a temperature in the range of about 750 degrees Centigrade to about 950 degrees Centigrade to form the $Sc_xAl_{1-x}N$ films having an impurity incorporation that is less than about $10^{19}/cm^3$ or less than about 0.001% of the material. In still other embodiments according to the invention, the ScAlN film can also have low concentrations of Oxygen and/or Silicon.

Figure 6:
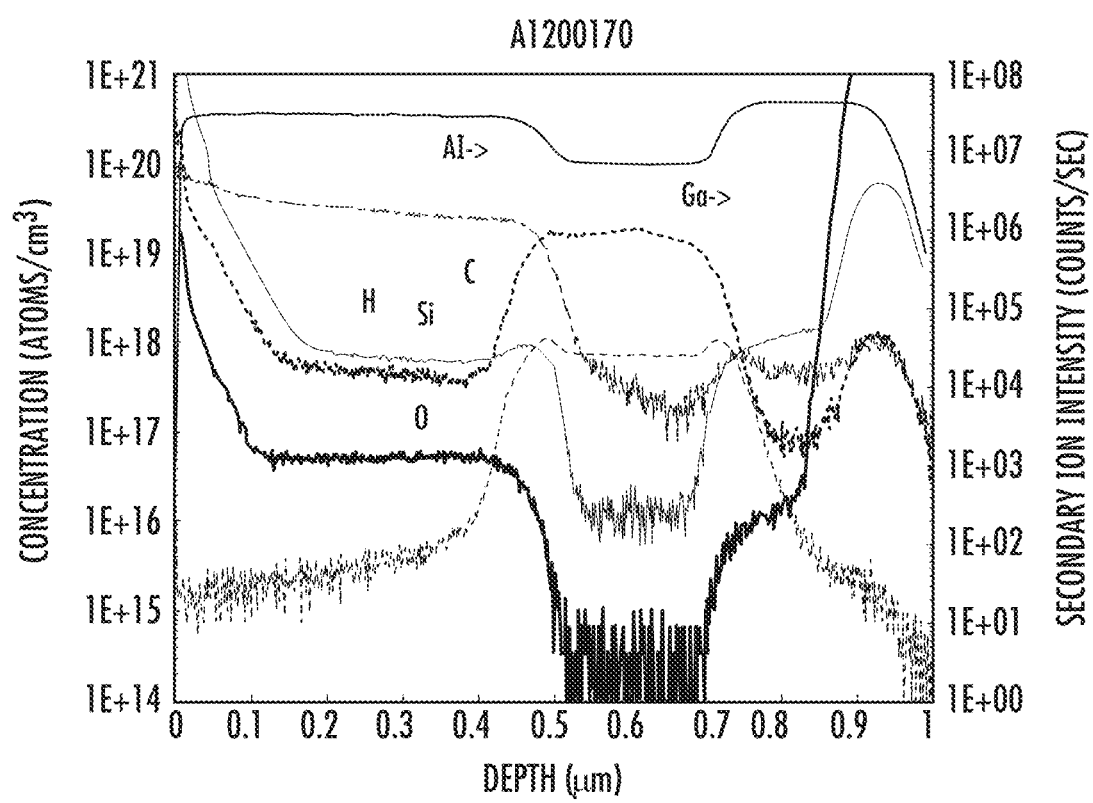
FIG. 6 is a graph showing SIMS analysis of $Sc_xAl_{1-x}N$ (14.3% Sc) where the $Sc_xAl_{1-x}N$ layer of interest is located about 0.1 microns to about 0.4 microns deep in the sample in some embodiments according to the invention.

FIG. 6 is a graph showing SIMS analysis of $Sc_xAl_{1-x}N$ (14.3% Sc) where the $Sc_xAl_{1-x}N$ layer of interest is located about 0.1 microns to about 0.4 microns deep in the analyzed sample as indicated on the x-axis of the graph in some embodiments according to the invention. According to FIG. 6, the Carbon concentration in the ScAlN film formed according to the present invention at the pertinent depth is less than $10^{19}/cm^3$. Accordingly, embodiments according to the present invention can be used to form ScAlN films with Carbon concentrations less than $10^{19}/cm^3$. As further show in FIG. 6, the Oxygen and Si concentrations in the $Sc_xAl_{1-x}N$ film formed according to the present invention at the pertinent depth may also be relatively low.

In some embodiments according to the present invention, $Sc_xAl_{1-x}N$ films having Carbon concentration less than about $10^{19}/cm^3$, can be formed using MOCVD with a Sc precursor characterizes by general formulae (1) or (2) and the other embodiments described above. In some embodiments according to the present invention, ScAlN films having Carbon concentration less than about $10^{19}/cm^3$, can be formed using a Sc precursor including $(DIPA)_3Sc$. Still further $Sc_xAl_{1-x}N$ films having Carbon concentration less than about $10^{19}/cm^3$ can be formed using MOCVD with any of the Sc precursors described above while the CVD reactor temperature is maintained between about 750 degrees Centigrade to about 950 degrees Centigrade during formation of the ScAlN film on the substrate. Alternatively, ScAlN films according to the present invention can be formed using MOCVD with any of the Sc precursors described above while the CVD reactor temperature is maintained outside the temperature range of about 750 degrees Centigrade to about 950 degrees Centigrade during formation of the ScAlN film on the substrate.

As further appreciated by the present inventors, the $Sc_xAl_{1-x}N$ film morphology can also be improved by controlling the ratio of the Group V (e.g., a precursor comprising nitrogen, such as $NH_3$) precursor to the Group III precursors (e.g, the Sc and Al precursors) used during the CVD growth process. In some embodiments according to the invention, the ratio of amount of the precursor including nitrogen to the combined amounts of the Sc precursor (such as the precursor characterized by general formulae (1) or the related embodiments, $(DIPA)_3Sc$ or the like) combined with the Al precursor is in a range between about, for example, 20,000 and about 500. In some embodiments, the range is between about 10,000 and about 500. In some embodiments, the range is between about 3000 and about 500.

Figure 7:
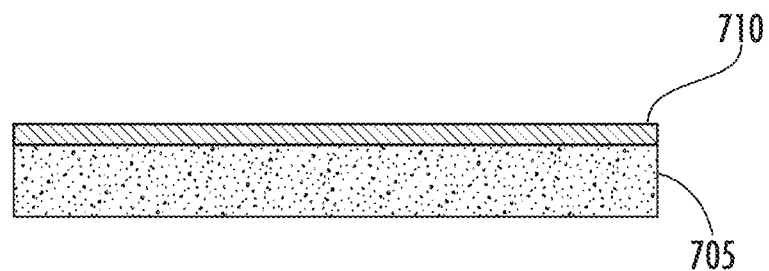
FIGS. 7-9 are cross-sectional illustrations of $Sc_xAl_{1-x}N$ films formed on a substrate in some embodiments according to the present invention.

FIG. 7 is a cross-sectional illustration of a $Sc_xAl_{1-x}N$ film 710 formed on a substrate 705 in some embodiments according to the present invention. According to FIG. 7, the substrate 705 can be Si (such as Si<111>), SiC, $Al_2O_3$, AlN, or GaN. The ScAlN film 710 can be formed using the MOCVD process to include Sc in a range of concentrations from about 10% to about 42% where the concentration of Sc is given as x in $Sc_xAl_{1-x}N$ in some embodiments according to the invention. In some embodiments according to the invention, the concentration of Sc in the $Sc_xAl_{1-x}N$ film 710 can be formed at a level sufficient to induce a stress in the $Sc_xAl_{1-x}N$ layer in a range between about 200 MPa compressive stress and about 200 MPa tensile stress when formed on the substrate 705. It will be understood that the $Sc_xAl_{1-x}N$ film 710 can be formed on the substrate 705 using any combination of the different embodiments of precursors, materials, etc. described herein for use as part of the MOCVD process within the temperature ranges described herein.

Figure 8:
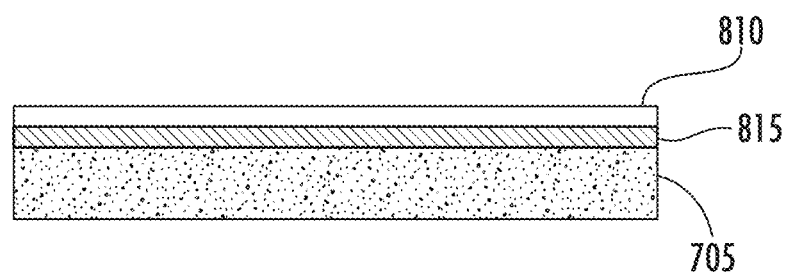

FIG. 8 is a cross-sectional illustration of a $Sc_xAl_{1-x}N$ film 810 formed on a substrate 705 in some embodiments according to the present invention. According to FIG. 8, a nucleation layer 815 can first be formed on the substrate 705. The $Sc_xAl_{1-x}N$ film 810 can be formed on the nucleation layer 815 using the MOCVD process to include Sc in a range of concentrations from about 10% to about 42% where the concentration of Sc is given as x in $Sc_xAl_{1-x}N$ in some embodiments according to the invention. The nucleation layer 815 can be formed so that components thereof are changed as the layer is formed to provide a desired lattice structure or strain to the $Sc_xAl_{1-x}N$ film 810 formed thereon. For example, if the nucleation layer 815 is AlGaN, then the amount of Al may be reduced as the nucleation layer 815 is deposited so that the nucleation layer 815 may be essentially AlN at the outset and transition to GaN at the upper portions of the nucleation layer 815 where the $Sc_xAl_{1-x}N$ film 810 is formed. Accordingly, a nucleation layer so formed could result in a lattice match for $Sc_{0.18}Al_{0.82}N$ (Sc 18%) or apply a compressive strain to a $Sc_xAl_{1-x}N$ film for Sc where x is greater than 18%.

In some embodiments according to the invention, the concentration of Sc in the $Sc_xAl_{1-x}N$ film 810 can be formed at a level sufficient, in combination with the nucleation layer 815, to induce a stress in the $Sc_xAl_{1-x}N$ layer in a range between about 200 MPa compressive stress and about 200 MPa tensile stress when formed on the substrate 705. It will be understood that the $Sc_xAl_{1-x}N$ film 810 can be formed on the nucleation layer 815 using any combination of the different embodiments of precursors, materials, etc. described herein for use as part of the MOCVD process within the temperature ranges described herein.

Figure 9:
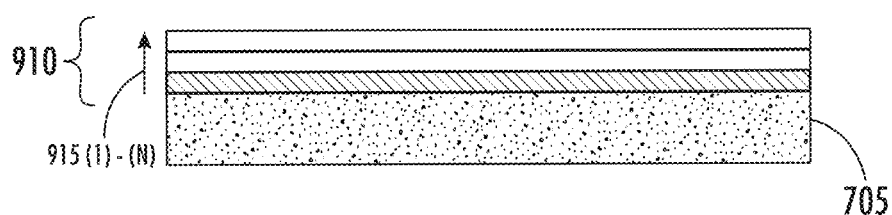

FIG. 9 is a cross-sectional illustration of a ScAlN film 910 formed on a substrate 705 in some embodiments according to the present invention. According to FIG. 9, the ScAlN film 910 can include a plurality of component ScAlN films 915-1 to N where each of the component $Sc_xAl_{1-x}N$ films can be formed using the MOCVD process to include Sc in a range of concentrations from about 10% to about 42% where the concentration of Sc is given as x in $Sc_xAl_{1-x}N$ in some embodiments according to the invention. In some embodiments according to the invention, the concentration of Sc in the $Sc_xAl_{1-x}N$ film 910 can be formed at a level sufficient to induce a stress in the $Sc_xAl_{1-x}N$ layer in a range between about 200 MPa compressive stress and about 200 MPa tensile stress when formed on the substrate 705. It will be understood that the ScAlN film 910 can be formed on the substrate 705 using any combination of the different embodiments of precursors, materials, etc. described herein for use as part of the MOCVD process within the temperature ranges described herein.

Figure 10:
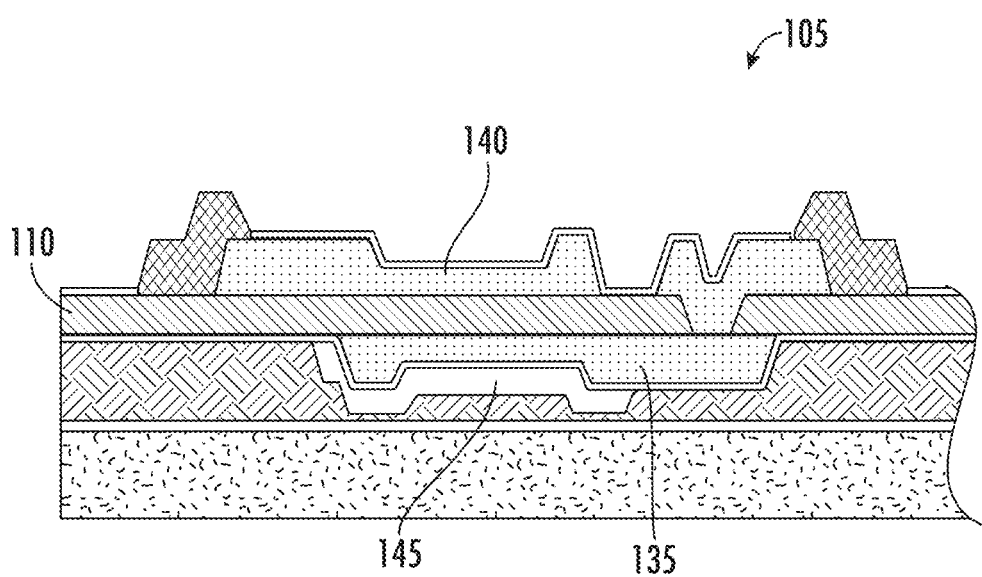
FIG. 10 is a cross-sectional illustration of a $Sc_xAl_{1-x}N$ film providing a single crystal piezoelectric resonator layer sandwiched between a bottom electrode and a top electrode in some embodiments according to the present invention.

As further appreciated by the present inventors, the $Sc_xAl_{1-x}N$ films formed according to embodiments of the invention can be included as single crystal piezoelectric films in resonator or filter circuits. For example, the $Sc_xAl_{1-x}N$ films described herein can be included in devices such as that shown in FIG. 10, to provide the single crystal resonator $Sc_xAl_{1-x}N$ layer 110 sandwiched between a bottom electrode 135 and a top electrode 140. The bottom electrode 135 is separated from the substrate by a resonator cavity 145 that allows the portion of the $Sc_xAl_{1-x}N$ layer 110 that is located between the top and bottom electrodes 135 and 140 to resonate responsive to electromagnetic energy impinging on that portion of the $Sc_xAl_{1-x}N$ layer 110 to create an electrical response at the top and bottom electrodes 135 and 140. The resonator cavity 145 also allows the portion of the $Sc_xAl_{1-x}N$ layer 110 that is located between the top and bottom electrodes 135 and 140 to resonate responsive to an electrical signal applied across the top and bottom electrodes 135 and 140. Further, the resonance of the $Sc_xAl_{1-x}N$ layer 110 can be affected by the level of Sc included in the shared $Sc_xAl_{1-x}N$ layer 110.

The MOCVD processes described herein can allow the $Sc_xAl_{1-x}N$ layer 110 to be formed to have a single crystal structure as described herein so that the composition of the $Sc_xAl_{1-x}N$ layer 110 has a composition that is free of segregated ScN crystalline structures to have a substantially uniform wurtzite crystal structure. For example, in some embodiments according to the invention, the $Sc_xAl_{1-x}N$ layer 110 can be made with a crystallinity of less than about 1.5 degrees Full Width Half Maximum (FWHM) by x-ray diffraction. In some embodiments according to the invention, the co-doped Group III-N piezoelectric material can be made with a crystallinity of less than about 1.0 degree at Full Width Half Maximum (FWHM) to about 10 arcseconds at FWHM measured using X-ray diffraction (XRD). In some embodiments according to the invention, the $Sc_xAl_{1-x}N$ layer 110 can be made with a crystallinity in a range between about 1.0 degree at Full Width Half Maximum (FWHM) to about 0.05 degrees at FWHM measured in the 002 direction using XRD. In some embodiments according to the invention, the $Sc_xAl_{1-x}N$ layer 110 can have a thickness of about 200 nm to about 1.3 microns.

Methods of forming a piezoelectric resonator device according to embodiments to the present invention using the MOCVD processes described herein can take advantage of a transfer process by forming the $Sc_xAl_{1-x}N$ layer (and portions which underlie the $Sc_xAl_{1-x}N$ layer) on a growth substrate. The entire structure can then be transferred to a carrier substrate (such as Si<100>) so that the growth substrate (on which the piezoelectric layer was grown) can be removed. Once the growth substrate is removed, the exposed backside of the piezoelectric layer can be processed to form, for example, a top electrode (for the resonator) and to form vias and contacts. Accordingly, the transfer process can allow both sides of the resonator device to be utilized.

As further appreciated by the present inventors, methods of forming a piezoelectric resonator device according to embodiments to the present invention using the MOCVD processes described herein can be used to form Surface Acoustic Wave resonator devices in some embodiments according to the invention, which may not utilize a transfer process.

Figure 11:
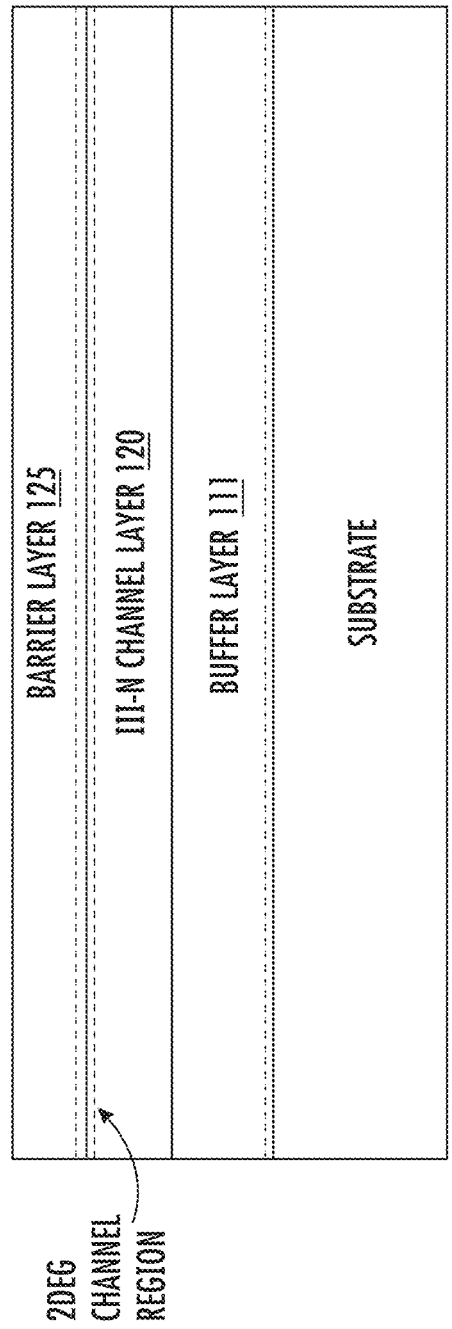
FIG. 11 is a cross-sectional illustration of the $Sc_xAl_{1-x}N$ film formed according to embodiments of the invention and included as a barrier layer in a material stack of a HEMT device configured for RF operation in some embodiments.

As further appreciated by the present inventors, the $Sc_xAl_{1-x}N$ film 110 can be formed according to embodiments of the invention for inclusion as a barrier layer in a HEMT device that can be configured for RF operation in some embodiments as illustrated in FIG. 11. According to FIG. 11, the $Sc_xAl_{1-x}N$ film 110 is included as the barrier layer 125 of the HEMT device as part of a stack of materials that can form the active layers of the HEMT device, including a III-N channel layer 120, a buffer layer 111 and an optional cap layer.

It will be understood that, in some embodiments, the HEMT stack of materials and the $Sc_xAl_{1-x}N$ layer 125, can be grown on the substrate using the MOCVD processes described herein (including by use of any combination of the aspects described herein). The material in the HEMT stack can be formed via MOCVD without a vacuum break being introduced during formation of the HEMT stack of materials and the $Sc_xAl_{1-x}N$ layer 125. In other words, once the CVD reactor is brought to the temperature range in some embodiments according to the invention, the process can continue until formation of the HEMT stack of materials is complete before the temperature is allowed to cool-down. It will be understood that the $Sc_xAl_{1-x}N$ layer formed to provide the barrier layer 125 of the HEMT device can be formed to a thickness in a range between about 5 nm and about 20 nm in some embodiments according to the present invention.

Figure 12:
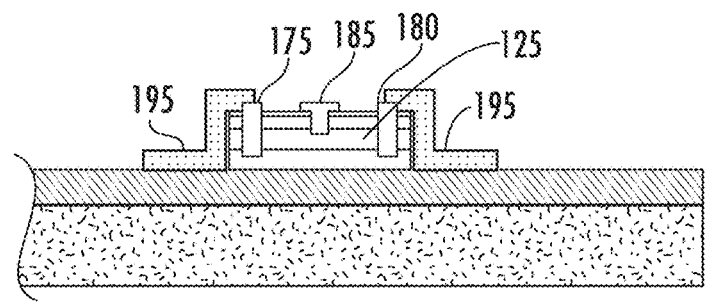
FIG. 12 is a schematic illustration of a HEMT device including a $Sc_xAl_{1-x}N$ layer formed according to embodiments of the invention.

FIG. 12 is a schematic illustration of a HEMT device including the $Sc_xAl_{1-x}N$ layer 125 described in FIG. 11 and formed according to embodiments of the present invention. According to FIG. 12, the HEMT device includes a source region 175, a drain region 180, and a gate 185. Respective metallizations 190 and 195 extend from the source region 175 and the drain region 180 off the source and drain regions in the HEMT stack to respective contacts.

Figure 13:
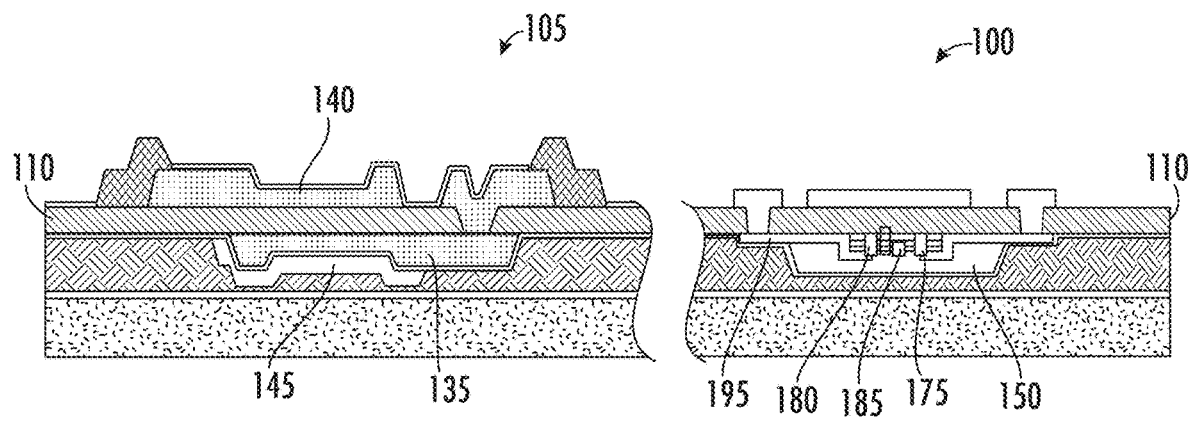
FIG. 13 is a cross-sectional schematic illustration of a monolithic RF Bulk Acoustic Wave (BAW) piezoelectric resonator device integrated with a HEMT device, where the $Sc_xAl_{1-x}N$ layer is a shared $Sc_xAl_{1-x}N$ layer providing the piezoelectric layer in the piezoelectric resonator device and the buffer layer in the HEMT device in some embodiments according to the present invention.

FIG. 13 is a cross-sectional schematic illustration of a monolithic RF Bulk Acoustic Wave (BAW) piezoelectric resonator device 105 integrated with a HEMT device 103 (shown inverted) including a shared $Sc_xAl_{1-x}N$ layer 110 providing the piezoelectric layer in the piezoelectric resonator device 105 and the buffer layer in the HEMT device 103 in some embodiments according to the present invention. According to FIG. 13, the shared $Sc_xAl_{1-x}N$ layer 110 extends across the monolithic carrier substrate to provide the piezoelectric layer of the resonator device 105 and the buffer layer of the HEMT device 103. The HEMT device 103 includes the HEMT stack of materials that form the active layers of the HEMT device 103 as described in FIG. 11, including a III-N channel layer, a barrier layer (that can also be formed of $Sc_xAl_{1-x}N$ at the same or different composition as the buffer layer), and an optional cap layer.

It will be understood that, in some embodiments, the HEMT stack of materials and the shared $Sc_xAl_{1-x}N$ layer 110, can be grown on the carrier substrate using the MOCVD processes described (and using an y combination of the aspects described herein) without a vacuum break being introduced during formation of the HEMT stack of materials and the shared $Sc_xAl_{1-x}N$ layer 110. It will be understood that the different portions of the shared $Sc_xAl_{1-x}N$ layer 110 (the HEMT portion and the resonator portion) can each be formed to the respective thickness that is described for each of those portions herein in some embodiments according to the present invention.

Figure 14:
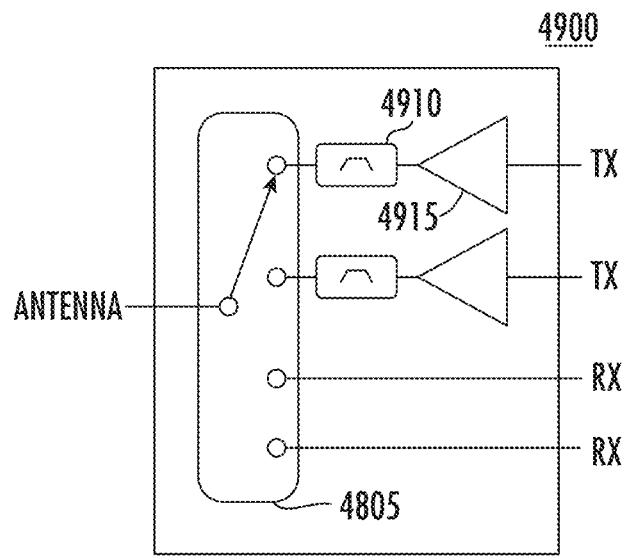
FIGS. 14-19 illustrate various RF devices that can include a $Sc_xAl_{1-x}N$ layer as any of a piezoelectric layer of the resonator device, the buffer layer of the HEMT device, and as the barrier layer of the HEMT device in some embodiments.

FIGS. 14-19 illustrate various RF devices that can include the $Sc_xAl_{1-x}N$ layers to provide both the piezoelectric layer of the resonator device and/the buffer layer of the HEMT device, only the barrier layer of the HEMT device, or only the piezoelectric layer of the resonator device in some embodiments. Other combinations are also possible within the scope of the present invention. FIG. 14 is a schematic illustration of a Transmit Module 4900 that includes a BAW filter 4910, an amplifier 4915, implemented using at least one HEMT device, and a switch 4805, implemented using at least one HEMT device assembled in an integrated form factor as described herein in some embodiments according to the present invention.

Figure 15:
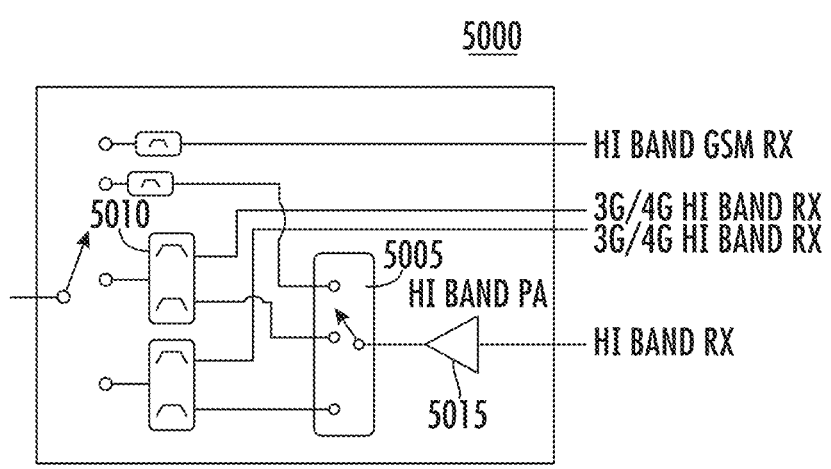

FIG. 15 is a schematic illustration of a Partial Complete Front End Module (CFE) High Band device 5000 that includes a BAW filter 5010, an amplifier 5015, implemented using at least one HEMT device, and a switch 5005, implemented using at least one HEMT device assembled in an integrated form factor as described herein in some embodiments according to the present invention.

Figure 16:
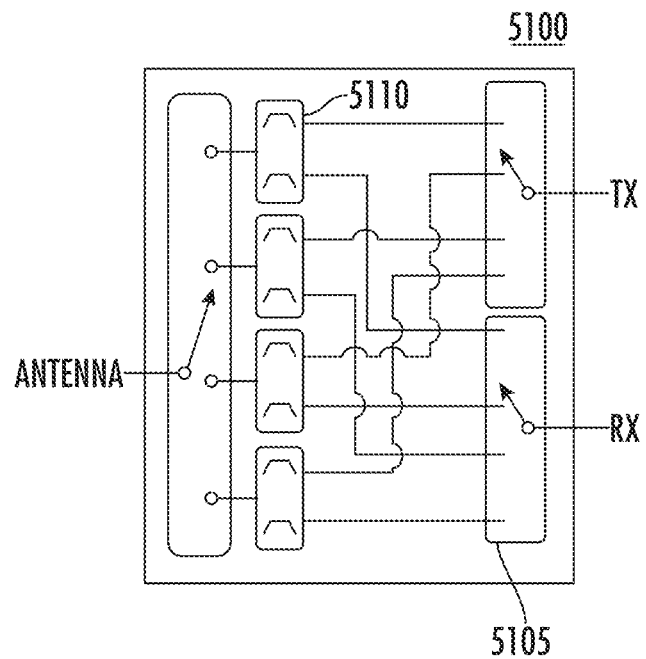

FIG. 16 is a schematic illustration of a switched duplexer bank 5100 that includes at least one BAW filter 5110 and at least one switch 5105 (implemented using at least one HEMT device, such as a bypass switch or a multi-throw switch, assembled in an integrated form factor in some embodiments according to the present invention.

Figure 17:
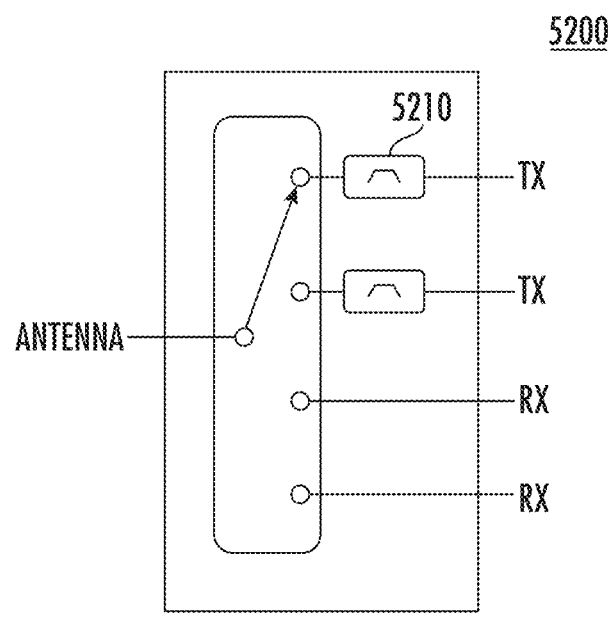

FIG. 17 is a schematic illustration of an antenna switch module 5200 that includes at least one BAW filter 5210 and at least one switch 5205 (implemented using at least one HEMT device, such as a bypass switch or a multi-throw switch, assembled in an integrated form factor in some embodiments according to the present invention.

Figure 18:
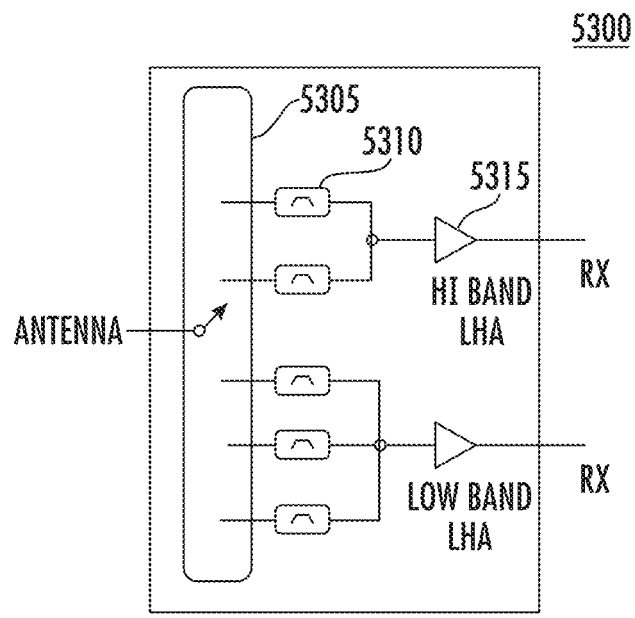

FIG. 18 is a schematic illustration of a Diversity receive FEM 5300 that includes at least one Low Noise Amplifier 5315, implemented using at least one HEMT device, at least one BAW filter 5310, and at least one switch 5305, implemented using at least one HEMT device, assembled in an integrated form factor in some embodiments according to the present invention.

Figure 19:
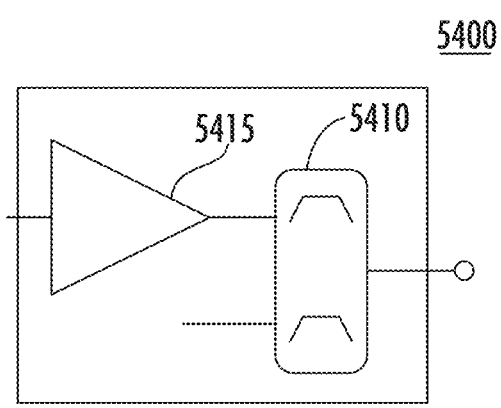

FIG. 19 is a schematic illustration of a Power Amplifier (PA) Duplexer 5400 that includes at least one Power Amplifier 5415 implemented using at least one HEMT device and at least one BAW filter 5410 assembled in an integrated form factor in some embodiments according to the present invention.

It will be understood that the embodiments illustrated in FIGS. 14-19 may include ScAlN as the barrier layer of the HEMT device, ScAlN as the piezoelectric layer of the resonator device or ScAlN as a shared buffer/piezoelectric layer as described herein.

Figure 20:
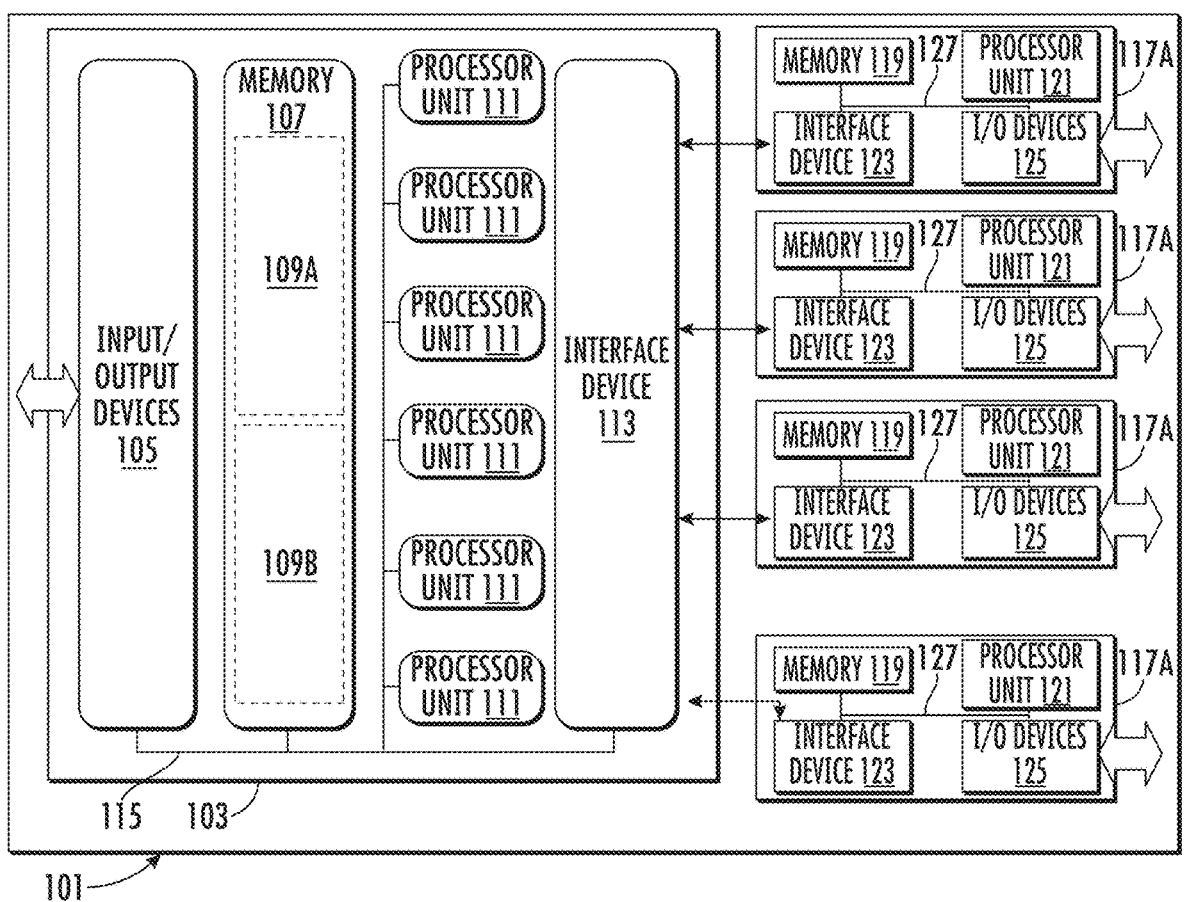
FIG. 20 is a block diagram that illustrates an example of a computing system that may be used to monitor and control operations (including maintaining the temperature of the CVD reactor as described herein) at of the MOCVD system 100 in some embodiments according to the invention.

FIG. 20 is a block diagram that illustrates an example of a computing system that may be used to monitor and control operations (including maintaining the temperature of the CVD reactor as described herein) at of the MOCVD system 100 in some embodiments according to the invention using a processor circuit 101 having a host or master computer and one or more remote computers. This operating environment is only one example of a suitable operating environment, however, and is not intended to suggest any limitation as to the scope of use or functionality of the disclosed technology.

In FIG. 20, the processor circuit 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing the operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel. Pentium. or Xeon microprocessors, Advanced Micro Devices Athlon™ microprocessors or Motorola 68K/Coldfire. microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

With some implementations of the disclosed technology, the master computing device 103 may employ one or more processing units 111 having more than one processor core. FIG. 20 illustrates an example of a multi-core processor unit 111 that may be employed with various embodiments of the disclosed technology. As shown in FIG. 20, the processor unit 111 includes a plurality of processor cores 201. Each processor core 201 includes a computing engine 203 and a memory cache 205.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

The interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each computer 117 may include a memory 119, a processor unit 121, an interface device 123, and, optionally, one more input/output devices 125 connected together by a system bus 127. As with the master computer 103, the optional input/output devices 125 for the computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. The memory 119 then may be implemented using any combination of the computer readable media discussed above. Like the interface device 113, the interface devices 123 allow the computers 117 to communicate with the master computer 103 over the communication interface.

In the illustrated example, the master computer 103 is a multi-processor unit computer with multiple processor units 111, while each computer 117 has a single processor unit 121. It should be noted, however, that alternate implementations of the disclosed technology may employ a master computer having single processor unit 111. Further, one or more of the computers 117 may have multiple processor units 121, depending upon their intended use, as previously discussed. Also, while only a single interface device 113 or 123 is illustrated for both the master computer 103 and the computers, it should be noted that, with alternate embodiments of the disclosed technology, either the computer 103, one or more of the computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the computers 117 may alternately or additionally be connected to one or more external data storage devices. Typically, these external data storage devices will include data storage devices that also are connected to the master computer 103, but they also may be different from any data storage devices accessible by the master computer 103.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the various embodiments described herein. As used herein, the term "and/or" includes any and all combinations of one or more of the associated listed items.

The terminology used herein is for the purpose of describing particular embodiments only and is not intended to be limiting to other embodiments. As used herein, the singular forms "a", "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or other structured to do so.

Unless otherwise defined, all terms (including technical and scientific terms) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

As will be appreciated by one of skill in the art, various embodiments described herein may be embodied as a method, data processing system, and/or computer program product. Furthermore, embodiments may take the form of a computer program product on a tangible computer readable storage medium having computer program code embodied in the medium that can be executed by a computer.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wired, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages, such as a programming language for a FPGA, Verilog, System Verilog, Hardware Description language (HDL), and VHDL. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computer environment or offered as a service such as a Software as a Service (SaaS).

Some embodiments are described herein with reference to flowchart illustrations and/or block diagrams of methods, systems and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall support claims to any such combination or subcombination.

What is claimed is:

1. A method of forming a film, the method comprising:
   heating a CVD reactor chamber containing a substrate to a temperature range;
   providing a first precursor comprising Al to the CVD reactor chamber in the temperature range;
   providing to the CVD reactor chamber in the temperature range a second precursor of general formula (2):

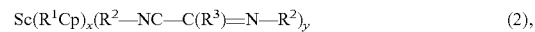

$$Sc(R^1Cp)_x(R^2-NC-C(R^3)=N-R^2)_y \qquad (2),$$

wherein $R^1$ is H or a $C_1$-$C_5$ alkyl chain, $R^2$ is H or a $C_1$-$C_5$ alkyl chain, $R^3$ is H or Me, x is 0, 1, or 2, y is 1, 2, or 3, with the proviso that x+y=3, and wherein there is one N atom for each outer shell electron of the Sc when x=0;
   providing a third precursor comprising NITROGEN to the CVD reactor chamber in the temperature range; and
   forming the film comprising ScAlN on the substrate.

2. The method of claim 1 wherein the temperature range is between about 750 degrees Centigrade and about 950 degrees Centigrade.

3. The method of claim 1 wherein a ratio of an amount of the N included in the third precursor to an amount of the Al and Sc in the first and second precursors, respectively, is in a range between about 500 and about 20,000.

4. The method of claim 1 wherein a ratio of an amount of the N included in the third precursor to an amount of the Al and Sc in the first and second precursors, respectively, is in a range between about 500 and about 3000.

5. The method of claim 1 wherein the substrate comprises Si, SiC, $Al_2O_3$, AlN, or GaN.

6. The method of claim 1 wherein forming the film comprises forming a compositionally uniform single crystal piezoelectric ScAlN acoustic resonator film.

7. The method of claim 1 further comprising:
   before forming the film comprising ScAlN, forming an AlN nucleation layer on the substrate.

8. The method of claim 7 further comprising:
   before forming the film comprising ScAlN, forming a buffer layer comprising AlN on the substrate including a graded amount of Sc therein as a function of a thickness of the buffer layer to provide the film comprising ScAlN having a percentage of Sc in a range between about 18% and about 42%.

9. The method of claim 8 wherein the film comprising ScAlN has a stress relative to the substrate in a range between about +200 MPa and about −200 MPa.

10. The method of claim 7 further comprising:
    before forming the film comprising ScAlN, forming a plurality of buffer layers comprising AlN on the substrate, wherein each successive one of the plurality of buffer layers has an increased percentage of Sc to provide the the film comprising ScAlN having a percentage of Sc in a range between about 18% and about 42%.

11. The method of claim 10 wherein the film comprising ScAlN has a stress relative to the substrate in a range between about +200 MPa and about −200 MPa.

12. The method of claim 7 further comprising:
before forming the film comprising ScAlN, forming a buffer layer comprising $Al_xGa_{1-x}N$ on the substrate including a graded decreasing amount of Al as a function of thickness of the buffer layer, to provide the film comprising ScAlN having a percentage of Sc in a range between about 18% and about 42%.

13. The method of claim 12 wherein the film comprising ScAlN has a stress relative to the substrate in a range between about +200 MPa and about −200 MPa.

14. The method of claim 7 further comprising:
before forming the film comprising ScAlN, forming a plurality of buffer layers comprising $Al_xGa_{1-x}N$ on the substrate, wherein each successive one of the plurality of buffer layers has decreased amount of Al to provide the film comprising ScAlN having a percentage of Sc in a range between about 18% and about 42%.

15. The method of claim 13 wherein the film comprising ScAlN has a stress relative to the substrate in a range between about +200 MPa and about −200 MPa.

16. The method of claim 1 wherein the film comprising ScAlN provides a barrier layer of a High Electron Mobility Transistor (HEMT) device configured to confine formation of a 2DEG channel region of the HEMT device.

17. The method of claim 16 wherein forming the film comprising ScAlN is preceded by:
forming a GaN channel layer including a GaN channel region on a buffer layer.

18. The method of claim 1 wherein the film comprising ScAlN forms a substantially uniform composition of wurtzite crystalline structure ScAlN, as measured by a variation of less than ±0.5 atomic % over 50 nm of scan distance.

19. The method of claim 18 wherein the substantially uniform composition of wurtzite crystalline structure ScAlN is substantially free of segregated ScN crystal structures.

20. The method of claim 18 wherein the substantially free of segregated ScN crystal structures is indicated by a Sc peak count at about 34.5 degrees in an XRD 2Theta scan that is less than 5% of the Sc peak count at about 36 degrees taken relative to the 110 crystal plane.

21. The method of claim 18 wherein the substantially uniform composition of wurtzite crystalline structure ScAlN is substantially free of segregated ScN crystal structures.

22. A method of forming a film, the method comprising:
heating a CVD reactor chamber containing a substrate to a temperature range providing a first precursor comprising Al to the CVD reactor chamber in the temperature range; providing a second precursor comprising Sc to the CVD reactor chamber in the temperature range, providing a third precursor comprising NITROGEN to the CVD reactor chamber in the temperature range; and
forming the film comprising ScAlN a concentration of C that is less than $10^{19}/cm^3$ on the substrate,
wherein the formed film comprising ScAlN exhibits a substantially uniform composition with a wurtzite crystalline structure, and is substantially free of segregated ScN crystal structures.

23. An RF integrated circuit device comprising:
a substrate; and
a High Electron Mobility Transistor (HEMT) device on the substrate including a ScAlN layer including a concentration of C that is less than $10^{19}/cm^3$ and configured to provide a barrier layer of the HEMT device to confine formation of a 2DEG channel region of the HEMT device
wherein the ScAlN layer forms a substantially uniform composition of wurtzite crystalline structure ScAlN, as measured by a variation of less than ±0.5 atomic % over 50 nm of scan distance.

24. A piezoelectric acoustic resonator layer comprising:
a substrate;
an MOCVD formed single crystal piezoelectric $Sc_xAl_{1-x}N$ layer on the substrate, where x is in a range between about 0.04 and about 0.41,
wherein the $Sc_xAl_{1-x}N$ layer layer has a substantially uniform composition of wurtzite crystalline structure, and is substantially free of segregated ScN crystal structures.

25. The piezoelectric acoustic resonator layer of claim 24 wherein the MOCVD formed single crystal piezoelectric $Sc_xAl_{1-x}N$ layer has a crystalline structure characterized by an XRD rocking curve FWHM value in a range between about less than 1.0 degrees to about 0.001 degrees as measured about an omega scan angle.

26. The piezoelectric acoustic resonator layer of claim 25 wherein the single crystal piezoelectric $Sc_xAl_{1-x}N$ layer has a thickness in a range between about 10 nm and about 2 um.

27. The piezoelectric acoustic resonator layer of claim 24 wherein the substrate comprises SiC, $Al_2O_3$, Si, or GaN.

28. A method of forming a piezoelectric acoustic resonator layer, the method comprising:
providing a substrate in a MOCVD reactor chamber;
heating the MOCVD reactor chamber to a temperature range;
introducing a first precursor comprising Al, a second precursor comprising Sc, and a third precursor comprising N, where the scandium precursor includes ligands that facilitate uniform film growth; and
forming an MOCVD single crystal piezoelectric $Sc_xAl_{1-x}N$ layer on the substrate, where x is in a range between about 0.04 and about 0.41.

29. The method of claim 28 wherein introducing the second precursor comprises:
providing a heated Sc precursor material to the reactor chamber at a temperature in a range between about 100 degrees Centigrade and about 250 degrees Centigrade to grow the MOCVD single crystal piezoelectric $Sc_xAl_{1-x}N$ layer.

30. The method of claim 28 further comprising:
maintaining a surface of the substrate at a growth temperature in a range between about 1200 degrees Centigrade to about 800 degrees Centigrade while forming the MOCVD single crystal piezoelectric $Sc_xAl_{1-x}N$ layer, wherein the growth temperature is measured using pyrometry.

31. The method of claim 29 further comprising:
maintaining a surface of the substrate at a growth temperature in a range between about 1050 degrees Centigrade to about 800 degrees Centigrade while forming the MOCVD single crystal piezoelectric $Sc_xAl_{1-x}N$ layer, wherein the growth temperature is measured using pyrometry.

32. The method of claim 29 wherein the heated Sc precursor material comprises $(DIPA)_3Sc$.

33. The method of claim 29 wherein the heated Sc precursor material comprises $(MeCp)_3Sc$.

* * * * *